(12) United States Patent
Mellier et al.

(10) Patent No.: US 9,798,024 B2
(45) Date of Patent: Oct. 24, 2017

(54) SEISMIC DETECTION LINE HAVING IDENTIFIED ELEMENT AND METHOD

(71) Applicant: SERCEL, Carquefou (FR)

(72) Inventors: Gaetan Mellier, Houston, TX (US); Simon LeBoeuf, Monnieres (FR); Alexis Duboué, Carquefou (FR); Noël Voisin, Lorient (FR)

(73) Assignee: SERCEL, Carquefou (FR)

( * ) Notice: Subject to any disclaimer, the term of this patent is extended or adjusted under 35 U.S.C. 154(b) by 406 days.

(21) Appl. No.: 14/518,183

(22) Filed: Oct. 20, 2014

(65) Prior Publication Data

US 2016/0109588 A1    Apr. 21, 2016

(51) Int. Cl.

| G01V 1/38 | (2006.01) |
|---|---|
| G01V 1/20 | (2006.01) |
| G01V 1/22 | (2006.01) |
| G01V 1/16 | (2006.01) |
| G01R 31/08 | (2006.01) |

(52) U.S. Cl.
CPC ............. G01V 1/201 (2013.01); G01V 1/22 (2013.01); G01V 1/3817 (2013.01); G01V 1/3826 (2013.01); *G01R 31/08* (2013.01); *G01V 1/162* (2013.01); *G01V 1/3835* (2013.01); *G01V 2200/14* (2013.01); *G01V 2210/1423* (2013.01)

(58) Field of Classification Search
CPC .......... G01V 1/162; G01V 1/201; G01V 1/38; G01V 1/3835
USPC ..................................................... 367/19, 20
See application file for complete search history.

(56) References Cited

U.S. PATENT DOCUMENTS

| 5,200,930 A | 4/1993 | Rouquette |
| 5,920,828 A * | 7/1999 | Norris ................... G01V 1/003 702/14 |
| 2006/0013065 A1 | 1/2006 | Varsamis et al. |

(Continued)

FOREIGN PATENT DOCUMENTS

| WO | WO 0003268 A1 * | 1/2000 |
| WO | 2013134193 A2 | 9/2013 |

OTHER PUBLICATIONS

European Search Report in corresponding European Application No. EP 15 30 6671 dated Apr. 4, 2016.

*Primary Examiner* — Ian J Lobo
(74) *Attorney, Agent, or Firm* — Patent Portfolio Builders PLLC

(57) ABSTRACT

A seismic detection line includes one or more identified element(s) arranged in a string, and a telemetry link connecting the element(s) along the string to convey seismic data from at least one of the element(s) to a data recorder and identification data to a topology controller. Each of the element(s) includes a respective first identification unit connected to the telemetry link to provide a respective first identifier to the topology controller. A seismic detection system also includes a processor that queries the identified element(s) for their respective identifiers, determines an arrangement of the seismic detection line using the received identifiers, and presents an indication of the determined arrangement. A method of operating a seismic detection line includes transmitting a query along the telemetry link, detecting whether the respective identifier of one of the element(s) was received or not, repeating until termination, and determining and indicating the arrangement.

20 Claims, 7 Drawing Sheets

(56) References Cited

U.S. PATENT DOCUMENTS

2009/0245019 A1\* 10/2009 Falkenberg .......... G01V 1/3835
  367/17
2010/0172207 A1\* 7/2010 Gulbransen ............ G01V 1/201
  367/19

\* cited by examiner

SEISMIC DETECTION LINE HAVING IDENTIFIED ELEMENT AND METHOD

BACKGROUND

Technical Field

Embodiments of the subject matter disclosed herein generally relate to seismic acquisition systems, devices and methods, and more specifically to management and testing of such systems.

Discussion of the Background

Seismic waves generated artificially for the imaging of geological layers have been used for many years. Reflection seismology is a method of geophysical exploration used to determine the properties of a portion of a subsurface layer in the earth, which information is especially helpful in the oil and gas industry. Seismic waves (i.e., sound or other pressure waves) are sent into the earth, directed toward the subsurface area. Seismic data are collected regarding the time it takes for the reflections of the generated seismic waves to come back to one or more receivers. Reflections are generally representative of interfaces between the layers of the subsurface. The seismic data can therefore be analyzed to generate a profile (image) of the geophysical structure, i.e., the layers of the investigated subsurface. This type of seismic acquisition or exploration can be used both on the subsurface of land areas and for exploring the subsurface of the ocean floor. For example, marine techniques send energy waves into the earth by first generating the energy waves in or on the ocean.

One way to perform marine seismic acquisitions or surveys is to tow an array of seismic receivers, which may be disposed on elongated streamers, by a vessel over the geographical area of interest (GAI) and to generate source signals with one or more sources (towed by said vessel or a dedicated vessel which tows only the sources), and receive corresponding reflections while traversing the GAI. This process is sometimes referred to as "shooting" a GAI or cell being surveyed.

As marine seismic surveying has increased in sophistication, it has become possible to tow more sources and receivers behind a single vessel. Streamers can now be up to 18 km long, towed at approximately 5 knots, 10 m below the ocean surface. In addition to sources or receivers, streamers can include "birds" with control surfaces used to position the streamer vertically or horizontally. Streamers can also include other components such as in-sea modules that process seismic data, recover modules, mammals detection modules, ranging modules, etc.

Given the length of streamers, they are generally stored spooled on winches on the back of the vessel when not in use. For example, a storage winch can hold up to 18 km of a streamer having a diameter up to 60 mm. Furthermore, components of streamers are often detachable from each other. This permits reconfiguring a streamer to include the number of positioning elements (e.g., birds), receivers, noise cancelling sections or other elements required to shoot a particular GAI. In this respect, note that a streamer may include tens if not hundreds of components that can be arranged in many different ways to form the streamer. Therefore, once a streamer is placed on a spool, it is very difficult to identify each component of the streamer and decide whether the streamer has the correct configuration for a next seismic survey. Even more, after a seismic survey is finalized and the vessel is deployed for another seismic survey requiring a different streamer configuration, it is logistically difficult for the vessel's operator to determine each component of the streamer for reconfiguring the streamer.

It is therefore desirable to be able to locate a particular element on a streamer to be removed or replaced while configuring streamers for a GAI, or for maintenance. It is also desirable for operators of seismic measurement systems to be able to audit their equipment inventory, e.g., their stock of streamer components. It is further desirable to be able to verify that a streamer was correctly configured.

A prior scheme for managing streamer elements includes personnel manually recording elements and their order along a streamer on paper spreadsheets. These spreadsheets are then cross-checked with design spreadsheets. However, this is time-consuming, expensive in labor, and error-prone. Another scheme involves placing radio-frequency identification (RFID) tags on one or more element(s) on a streamer. RFID-tagged components can be identified automatically during deployment of the streamer, by passing the streamer within the read range of an RFID reader, e.g., in the back deck of the vessel. Although this may help verify a streamer configuration, scanning RFID tags during deployment of the streamer does not help with the process of assembling the streamer including the correct elements in the correct order. In other words, if the RFID scanning is performed when the streamer is still on the spool, a topology of the streamer cannot be detected. Moreover, when a streamer is wound on a winch, RFID signals from components closer to the axis of the winch can be distorted or attenuated by components farther from the axis of the winch, and information about the elements is lost. Current schemes use manual recordkeeping for equipment on winches, which recordkeeping is time-consuming and error-prone. Accordingly, there is a continuing need for ways of accurately determining the elements present on a seismic line, and their order, even when the streamer is on the spool in the back of the vessel. There is a further need for ways of locating faulty components on a streamer.

BRIEF DESCRIPTION

According to an embodiment, there is a seismic detection line, including one or more identified element(s) arranged in a string along the seismic detection line; and a telemetry link connecting the identified element(s) along the string and configured to convey seismic data from at least one of the identified element(s) to a data recorder and identification data to a topology controller, wherein each of the identified element(s) includes a respective first identification unit operatively connected to the telemetry link to provide a respective first identifier to the topology controller.

According to another embodiment, there is a seismic detection system, including a seismic detection line having one or more identified element(s) arranged in a string along the seismic detection line, and a telemetry link connecting the identified element(s) along the string and configured to convey seismic data from at least one of the identified element(s) to a data recorder and identification data to a topology controller, wherein each of the identified element(s) includes a respective first identification unit operatively connected to the telemetry link to provide a respective first identifier to the topology controller; and a processor operatively coupled to the telemetry link and configured to successively query the identified elements for their respective identifiers, determine an arrangement of the seismic detection line using the received identifiers, and present an indication of the determined arrangement.

According to yet another embodiment, there is a method of operating a seismic detection line, the method including transmitting a query along a telemetry link of the seismic detection line, wherein the telemetry link connects a plurality of identified elements of the seismic detection line in a string and each of the identified elements includes an identification unit configured to transmit a respective identifier; detecting whether the respective identifier of one of the element(s) was received or not; repeating the transmitting and detecting steps until a selected termination criterion is satisfied; using a processor to automatically determine an arrangement of the identified elements of the seismic detection line; and using the processor to automatically present an indication of the determined arrangement.

BRIEF DESCRIPTION OF THE DRAWINGS

For a more complete understanding of the present invention, reference is now made to the following descriptions taken in conjunction with the accompanying drawings, in which.

DETAILED DESCRIPTION

The following description of the exemplary embodiments refers to the accompanying drawings. The same reference numbers in different drawings identify the same or similar elements. The following detailed description does not limit the invention. The following embodiments are discussed, for simplicity, with regard to the terminology and structure of towed marine seismic survey devices. However, the embodiments discussed are not limited to that configuration, but may be used in other types of seismic surveys, e.g., land, seabed, or borehole surveys.

Reference throughout the specification to "one embodiment" or "an embodiment" (or "aspect") means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Throughout this description, some embodiments are described in terms that would ordinarily be implemented as software programs. Those skilled in the art will readily recognize that the equivalent of such software can also be constructed in hardware, firmware, micro-code, or combinations of these with each other or with software. Given the systems and methods as described herein, software not specifically shown, suggested, or described herein that is useful for implementation of any embodiment is conventional and within the ordinary skill in such arts.

Figure 1:
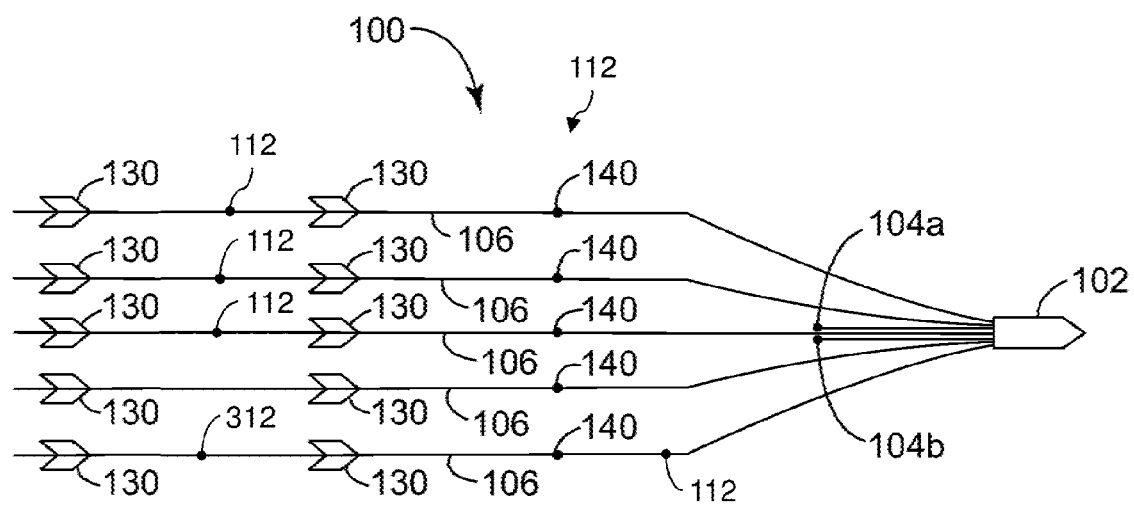
FIG. 1 is a top schematic view of an exemplary marine seismic acquisition or exploration system.

FIG. 1 shows an exemplary seismic acquisition system 100 including a vessel 102 towing plural streamers 106 that may extend over kilometers behind vessel 102. Each of the streamers 106 can include one or more birds 130 that maintain the streamer 106, to which they are attached, in a known and controllable position relative to other streamers 106. As noted above, birds 130 are capable of moving streamers 106 as desired according to communications or commands which birds 130 receive from vessel 102. One or more sources (or source arrays) 104a, 104b (referenced individually or collectively by reference number 104) may also be towed by vessel 102 (or another vessel, not shown) for generating seismic waves. The seismic waves generated by sources 104 propagate downwardly, and either reflect off of or penetrate the seafloor. The penetrating waves eventually are reflected by one or more reflecting structures (not shown), which are disposed in the seafloor subsurface, back toward the surface. The reflected seismic waves propagate upwardly and are detected by receivers 140 provided on streamers 106. Receivers 140 provide seismic data of detected reflections to a data recorder 211 (FIG. 2A) on vessel 102. Sources 104 can be placed either in front of or behind the receivers 140 which are attached to the streamers 106, or both behind and in front of receivers 140. Each of the streamers 106 can include one or more receivers 140; for simplicity, only one receiver 140 is shown per streamer 106. A receiver 140 may be any one or a combination of a hydrophone, geophone, accelerometer, optical component, etc. Receivers 140 are examples of identified elements 112 on streamers 106. An identified element 112 is an element of the streamer that can be accurately identified by a controller on board of the vessel as will be discussed next. Other examples of identified elements 112 are discussed below, e.g., with reference to FIG. 2. Each streamer 106 can include one or more identified elements 112. Each streamer 106 can also include one or more unidentified elements 312, discussed below with reference to FIG. 3.

Each element of a seismic line can have a seismic telemetry link (electrical, optical or radio) going through it. The seismic telemetry link can go through passive elements, such as lead-ins, stretch sections, or interconnection sections and not be electrically interrupted. The seismic telemetry link can also go through or be connected to active elements (such as electronic modules or acquisition electronics), which participate in providing seismic data back to the seismic central system, e.g., data recorder 211 in FIG. 2A.

According to various embodiments, into each passive element is integrated an electronic identification unit (IDU) that communicates in ways compatible with the seismic telemetry link, so that the IDU can be identified by the seismic acquisition system (even though it does not directly contribute to the recovery of the seismic data), and so can be integrated in the topology view that is usually displayed for active elements.

Figure 2A:
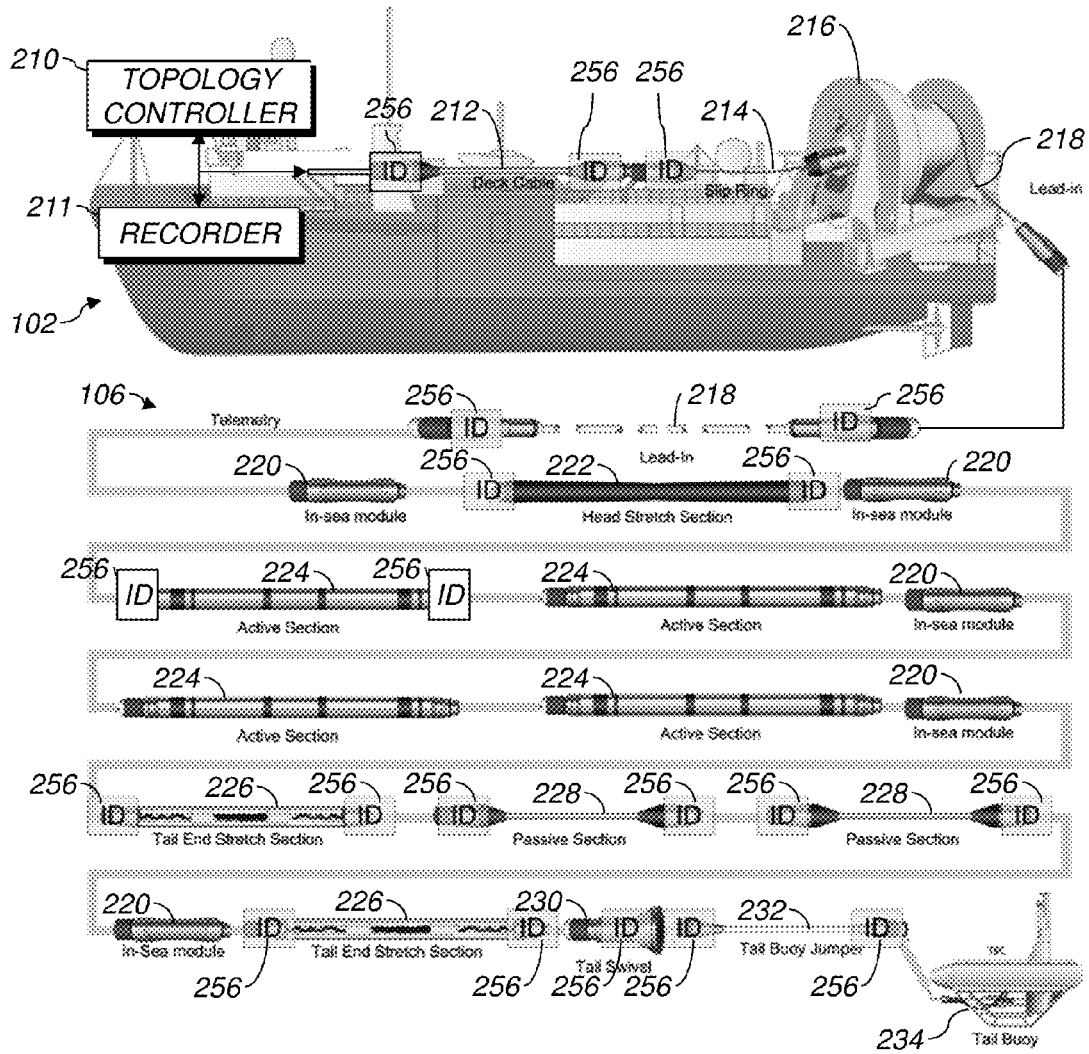
FIGS. 2A and 2B show a schematic of an exemplary seismic vessel and an exemplary streamer.
Figure 2B:
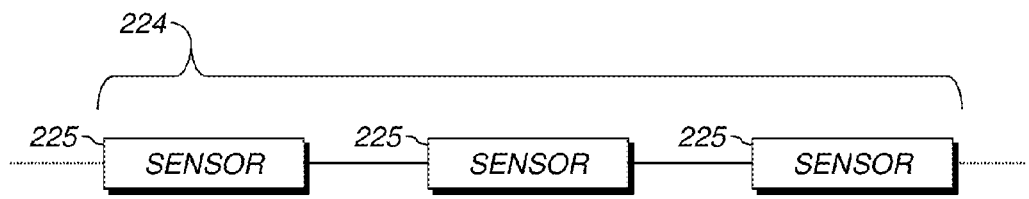

FIGS. 2A and 2B show a schematic of an exemplary seismic vessel 102 and an exemplary streamer 106 including IDUs 256. Streamer 106 is a representative seismic configuration including a slip-ring, lead-in, passive sections, stretch sections, and other sections, as discussed below. Referring to FIG. 2A, seismic vessel 102 carries a topology controller 210 and a data recorder 211 ("recorder") for recording seismic data. Topology controller 210, as discussed later, is connected to identification units 256 associated with streamer 106. Topology controller 210 and data recorder 211 are communicatively connected to a deck cable 212, which is connected via a slip ring 214 or other connection to streamer 106. In one application, topology controller 210 and data recorder 211 can reside in the same controller or computing device. In this example, streamer 106 is shown predominantly uncoiled from a winch 216. Note that a telemetry link used by data recorder 211 for receiving seismic data from various receivers distributed along the streamer is shared with topology controller 210 for determining a topology of streamer 106.

In prior schemes, only the active sections 224 would have electronics useful for seismic data reporting. According to an embodiment, each section of the streamer includes electronics that is capable of reporting an ID of that specific section. For example, the seismic electronics used in a streamer may also be located in each section for reporting information related to the streamer's topology. Thus, in one application, existing electronics in the active sections are programmed to also report ID related information of respective sections and the same electronics is added to the passive sections for topology related purposes. In various aspects herein, identification units (IDUs) 256 are the electronics used to provide topology reporting for passive elements, e.g., lead in sections, extenders, or elastic sections used to mechanically isolate sections from the vibration noise. Passive sections themselves are generally not visible on topological plots because they do not integrate electronics that can be recognized by the topology controller 210. The IDUs 256 are recognizable and advantageously permit automatically providing a complete topological view including both passive and active elements.

The portion of the steamer 106 connected to the winch in this exemplary embodiment is referred to as lead-in 218. Following one or more lead-in segment(s) 218 may be an in-sea module 220. In-sea module 220 includes electronics to perform, e.g., processing or conversion of seismic data. In-sea module 220 is followed by a head stretch section 222 and, optionally, another in-sea module 220. One or more active section(s), e.g., four active sections in the figure, follow the in-sea module 220. An in-sea module is placed after, e.g., every two active sections, for a total of four in-sea modules 220 in the illustrated exemplary configuration. After the last in-sea module 220 are, in order, a tail end stretch section 226, one or more passive sections 228, a tail end stretch section 226, a tail swivel 230, a tail buoy jumper 232, and a tail buoy 234. These elements are referred to herein collectively or individually as identified elements 112.

Some of the elements include at least one identification unit (IDU) 256. In this example, each of elements 212, 218, 222, 226, 228, and 232 has a respective IDU at each end. Elements 214, 230 have a single IDU. IDUs are capable of communicating with topology controller 210, as discussed below with reference to FIG. 3. IDUs can serve to label or mark each element (passive or active) or sections of streamer 106. In this way, a real time topology view of elements (e.g., passive and active) connected to the streamer or other seismic line can be provided. This permits vessel and survey personnel to readily determine at any time what elements are connected to a particular streamer.

In various aspects, IDUs 256 use the same interface to telemetry link 315 as do active elements transmitting seismic data. In various aspects, the same network-layer or lower protocols are used for transmission of IDs and seismic data. Use of the same interface or the same protocol for transmission of both IDs and seismic data is referred to herein as "common link" operation. Common links can operate at various logical layers of the transmission stack, e.g., the physical, data link, network, transport, or application layers. In one non-limiting example of a common link, IDUs 256 and active elements use the same physical connector and physical-layer protocol to interface with telemetry link 315. In at least one aspect, an IDU 256 includes seismic sensor electronics, but without the channels (e.g., without a MEMS sensor, or geophone, or hydrophone). IDUs 256 can be included in the terminations of each passive element, or attached or affixed thereto. In various aspects, active sections 224 and in-sea modules 220 already include electronics or processors that may be configured in software to provide ID data to topology controller 210, so those sections 224 and modules 220 do not use IDUs 256 (as shown). In other aspects, one or more IDUs 256 is integrated into each of those components. In one application, the IDU 256 is the electronics or processors present in the active sections and/or in-sea modules.

According to various aspects, therefore, a seismic detection line includes one or more identified element(s) 112 arranged in a string along the seismic detection line. Examples of seismic detection lines include streamer 106; a land cable configured to be deployed over land, e.g., at ground level or in a trench; and a cable configured to be deployed on a bed of a body of water (also called an ocean bottom cable or a seabed cable). The seismic detection line includes a telemetry link, e.g., telemetry link 315 (FIG. 3) connecting the identified element(s) 112 along the string and configured to convey seismic data from at least one of the identified element(s) 112 to data recorder 211, and identification data to topology controller 210. In configurations in which the seismic detection line is a streamer 106, at least one of the identified element(s) 112 can be configured to be mounted to winch 216. Moreover, in such configurations, the one or more identified element(s) 112 can include one or more bird(s) 130 attached to the seismic detection line (streamer 106) and configured to assist in positioning the seismic detection line (streamer 106).

Examples of identified element(s) 112 include in-sea module 220, active section 224 configured to provide seismic data to the data recorder 211, birds 130, recovery devices, passive sections, ranging sections, mammals detection sections, deck cable 212, slip ring 214, lead-in 218, head stretch section 222, tail end stretch section 226, passive section 228, tail end stretch section 226, tail swivel 230, tail buoy jumper 232, tail buoy 234, and essentially any element that is present in a streamer. Each of the identified element(s) 112, e.g., active section 224, includes a respective first IDU 256 operatively connected to the telemetry link 315 to provide a respective first identifier to the topology controller 210.

In various aspects, each of the elements on the seismic detection line is an identified element 112, specifically, in these aspects, the one or more identified element(s) 112 includes all the active seismic elements (e.g., active section 224) and all the passive elements (e.g., passive section 228) on the seismic detection line (e.g., streamer 106). In other aspects, the seismic detection line includes at least one unidentified element 312, discussed below with reference to FIG. 3. In some configurations, the seismic detection line includes at least one non-identified (i.e., unidentified) active seismic element such as element 312 (FIG. 3) arranged along the string and operatively connected to provide seismic data to the data recorder 211. In these configurations, seismic data can be provided to data recorder 211 and identification information can be provided to topology controller 210, but both seismic data and identification information can be carried over the same telemetry link 315.

FIG. 2B shows an exemplary configuration of an active section 224. In this example, the active section 224 includes three seismic sensors 225. Using multiple sensors 225 in an active section 224 permits, e.g., averaging received data to reduce noise. Any number of sensors 225 can be used in an active section 224. Different active sections 224 can have the same number of sensors 225 or different numbers of sensors 225.

Still referring to FIGS. 2A and 2B, there is shown a seismic detection system. The system includes a seismic detection line, e.g., streamer 106. Streamer 106 includes one or more identified element(s) (e.g., elements 218, 220, 222, 224, 226, 228, 230, 232, or 256, collectively or individually referred to herein by reference 112) arranged in a string along streamer 106. Streamer 106 also includes a telemetry link 315 (FIG. 3) connecting the identified element(s) 112 along the string and configured to convey (a) seismic data from at least one of the identified element(s) 112 to a data recorder 211 and (b) identification data to a topology controller 210. Each of the identified element(s) 112 includes a respective first identification unit 256 operatively connected to the telemetry link 315 to provide a respective first identifier to the topology controller 210. As already noted, identification unit 256 may be an existing controller or electronics associated with seismic data processing and located in a streamer section. Topology controller 210 and data recorder 211 can be embodied in one device or more than one device, and the algorithms can be carried out using one processor 886 (FIG. 8) or multiple processors 886.

A processor 886 can be embodied in, e.g., topology controller 210, which is operatively coupled to the telemetry link 315 and configured to successively query the elements 112 for their respective identifiers, determine an arrangement of the streamer 106 (or other seismic detection line, and likewise throughout) using the received identifiers, and present an indication (e.g., an image on a monitor) of the determined arrangement. In one application, processor 886 can generate an image similar to that shown in FIG. 2A, indicating the exact location of each component of the streamer relative to the vessel. The processor 886 can further be configured to present a fault indication corresponding to an element 112 from which no respective identifier (ID) is received. The fault indication can, e.g., be presented when the processor 886 did not establish communication with the IDU 256 corresponding to the element 112. The one or more identified element(s) 112 can include at least one active section 224 configured to transmit seismic data via the telemetry link 315, and the processor 886 can be configured to record the seismic data from the active section 224 via the telemetry link 315.

Figure 3:
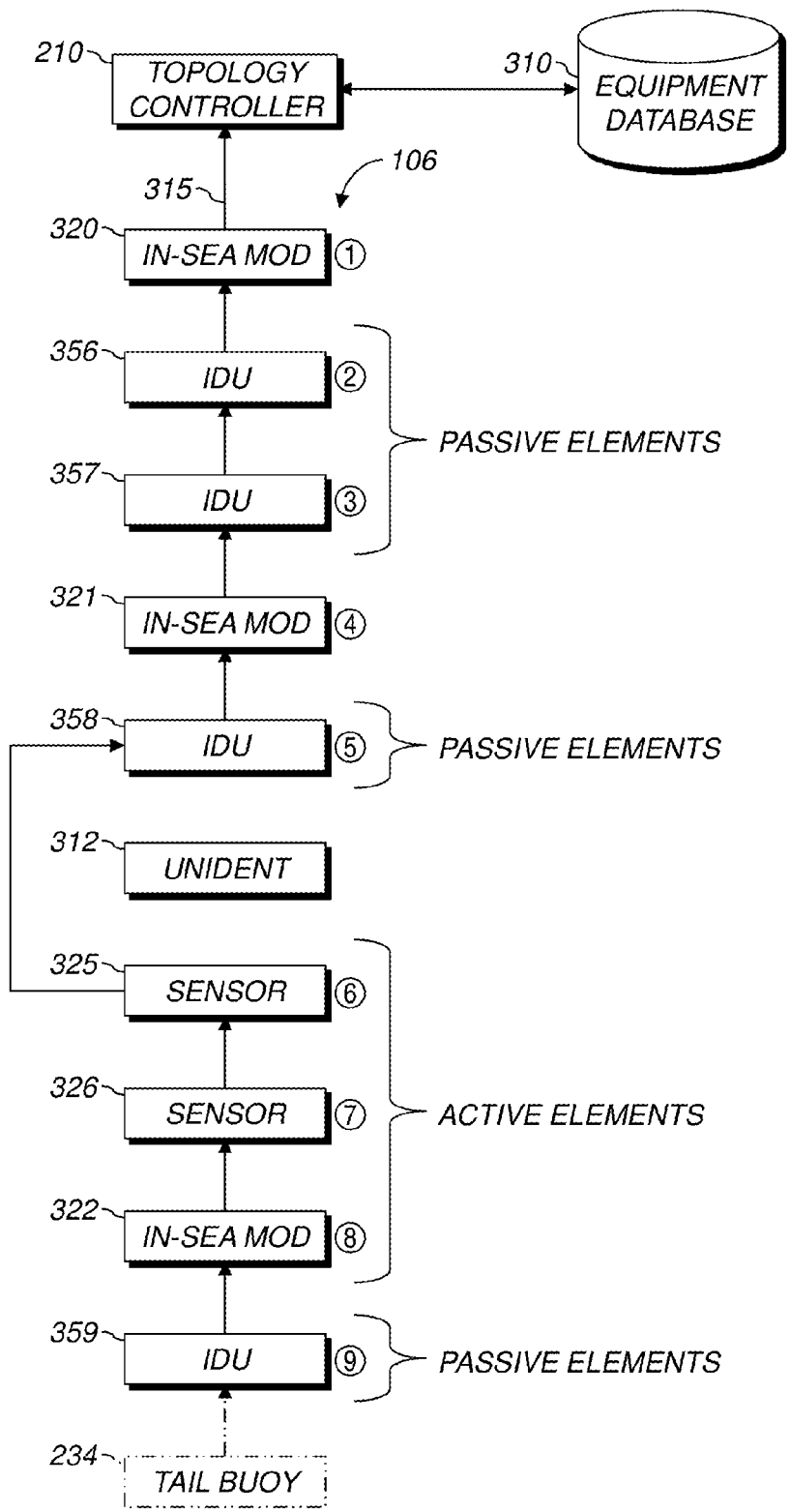
FIG. 3 is a schematic of data communications in an exemplary seismic system.

FIG. 3 is a schematic of data communications in an exemplary seismic system. Topology controller 210 on a seismic vessel communicates with equipment database 310, discussed below. Device(s) in streamer 106 communicate with topology controller 210 via telemetry link 315. As used herein, "upstream" communications are towards topology controller 210 and "downstream" communications are away from topology controller 210. Seismic data are normally sent upstream via telemetry link 315 to data recorder 211 (FIG. 2A).

In this example, telemetry link 315 is a serial bus or other data communications link between the topology controller 210 or the data recorder 211 and elements of the seismic detection line, e.g., IDUs 256 or active elements 224. Telemetry link 315 can include, e.g., one or more twisted pairs or other pairs of conductors, shielded or unshielded (e.g., two pairs of conductors). One twisted pair can be used for upstream transmissions and a separate twisted pair for downstream transmissions, or a single twisted pair can be used for bidirectional communications, e.g., by time- or frequency-division multiplexing or collision-detection approaches such as that used in Ethernet. The twisted pair(s) can carry power and data, e.g., in separate frequency bands (e.g., DC power and AC signal). RS-422, RS-485, Ethernet, or other protocols can be used to communicate via telemetry link 315. Various bus protocols can be used to communicate via telemetry link 315, e.g., half-duplex or full-duplex protocols, or synchronous or asynchronous protocols.

In this example, starting from the recorder, the devices on the telemetry link 315 are in-sea module 320, identification unit (IDU) 356, IDU 357, in-sea module 321, IDU 358, sensor 325, sensor 326, in-sea module 322, and IDU 359. Tail buoy 234, shown in phantom, is connected to the telemetry link 315 in at least one aspect. Each of these devices is referred to herein as an "identified element" (element 112, FIG. 1) that can transmit an identifier (an ID) to the topology controller 210. Note that each element except element 312 has at least one IDU (not shown). In one application, one or more of the identified elements have two IDU, one at each end, for determining not only a position of the identified element in the streamer, but also an orientation of the identified element relative to the vessel. In addition, the exemplary streamer 106 includes an unidentified element 312 physically arranged on the streamer between IDU 358 and sensor 325, but not connected to telemetry link 315. Streamer 106 can include any combination of identified and unidentified elements. For example, additional identified elements can be connected to telemetry link 315 between IDUs 356, 357. Identified elements can be either active elements (e.g., sensors 325, 326) or passive elements (e.g., passive section 228, FIG. 2A). Unidentified elements can likewise be either active or passive. In this example, IDUs 356, 357, 358, 359 correspond to passive elements, and sensor 325, sensor 326, and in-sea modules 320, 321, 322 are active elements.

Topology controller 210 can query the IDs of the identified elements 112 in various ways. Each ID can include, e.g., a 128-bit globally unique identifier (GUID) such as used in MICROSOFT WINDOWS systems, a 128-bit universally unique identifier (UUID) such as used in OSF DCE systems, a Media Access Control (MAC) address such as a 48-bit Ethernet MAC address, or a ONE-WIRE 64-bit unique identifier. The topology controller 210 can store in equipment database 310 a mapping between position on the streamer and received ID. Position can be determined by each IDU 256 incrementing a data field of a data frame transmitted by the topology controller 210. In this way, as the data frame passes successive IDUs 256, positions of the corresponding identified element(s) 112 are determined. In the example shown, the mapping is position 1→element 320, 2→356, 3→357, 4→321, 5→358, 6→325, 7→326, 8→322, 9→359. In FIG. 3, these positions on the streamer are shown as circled numbers.

Figure 4:
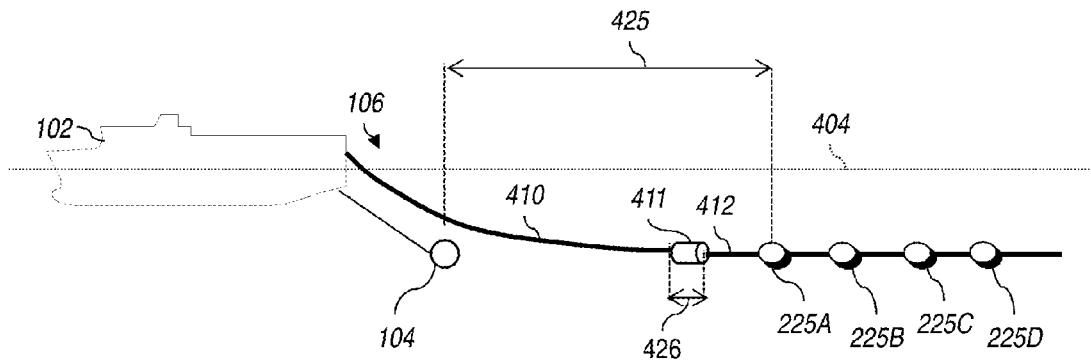
FIG. 4 is a side elevation of an exemplary seismic operation.

FIG. 4 is a side elevation of an exemplary seismic operation. Vessel 102 is under way, towing source 104 and streamer 106 below waterline 404. For simplicity, the figure shows a single streamer, but in practice, more than one streamer is towed by the vessel. Streamer 106 includes identified element 410 (e.g., a passive section) and sensors 225A, 225B, 225C, 225D. As shown, it is desirable to determine the horizontal distance 425 between source 104 and sensor 225A (and likewise for the other sensors) in order to accurately process the seismic data detected by sensor 225A. Distance 425 can be determined by summing the lengths along the horizontal of the elements of the streamer, e.g., length 426 of element 411 and corresponding lengths of elements 410, 412. Lengths can be stored in equipment database 310 (FIG. 3) for various types of equipment. Looking up the IDs of elements on streamer 106 in equipment database 310 advantageously permits determining distance 425 without having to, e.g., unroll hundreds of meters of streamer 106 on the deck of vessel 102 and measure manually. Database lookup also advantageously permits automatically recalculating distance 426 when elements are added to or removed from streamer 106 between vessel 102 and sensor 225A, and likewise for other sensors or distances along the streamer.

Figure 5A:
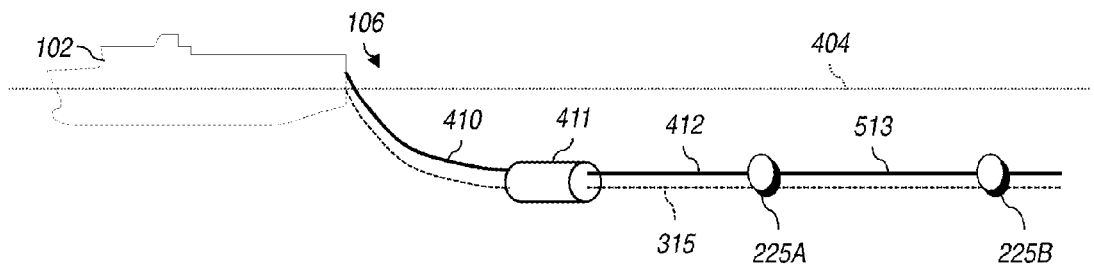
FIGS. 5A and 5B are side elevations of exemplary seismic operations.

FIG. 5A is a side elevation of an exemplary seismic operation. In aspects using serial or daisy-chain telemetry links 315 (represented graphically by the dashed line), a break or failure anywhere in the telemetry link 315 can disrupt connectivity to any element downstream of the break. When such breaks happen, it is necessary for survey personnel to determine the location of the break in order to fix it. In the example shown, a break anywhere upstream of sensor 225A will result in loss of communication with sensor 225A. Survey personnel will have to test elements 410, 411, and 412 to locate the failure, and may have to test sensor 225A to determine whether the loss of communication was caused by a sensor failure rather than a telemetry-link failure. This investigation is characteristic of various prior schemes and may be easily performed using the ID of each element, as discussed next.

Figure 5B:
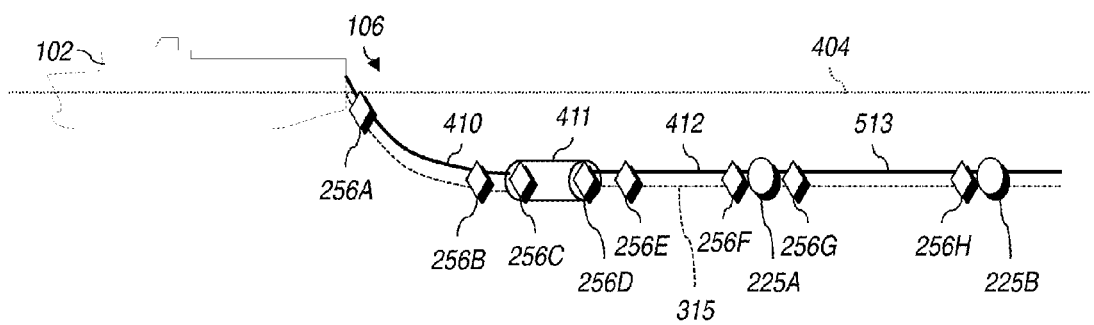

FIG. 5B is a side elevation of an exemplary seismic operation using IDUs. IDU 256A is located on an upstream end of element 410 and IDU 256B is located on a downstream end of element 410. Likewise, IDUs 256C, 256D are located on upstream, downstream ends of element 411; IDUs 256E, 256F on element 412; and IDUs 256G, 256H on element 513. If a break happens upstream of sensor 225A, some of the IDUs 256A-256F may still be reachable via the telemetry link 315. If none of the IDUs 256A-256F is reachable, the fault is upstream of element 410. If IDU 256A is reachable but IDU 256B is not, the fault is in element 410. If IDUs 256A, 256B are reachable but IDU 256C is not, the fault is in the connection between element 410 and element 411. Likewise, throughout streamer 106, the fault is between the farthest-downstream reachable IDU 256 (i.e., the farthest-downstream IDU 256 with which topology controller 210 can conduct normal communications) and the next IDU 256 downstream. This advantageously permits accurately determining the locations of faults even while the streamer is operating or vessel 102 is underway, which in turn permits sending a workboat to repair the fault. Any number of IDUs 256 can be used on any number of identified elements. The more IDUs 256 are used, the more narrowly a fault can be targeted.

Accordingly, in various aspects, a seismic detection line (e.g., streamer 106) includes first identification units (e.g., IDUs 256A, 256C, 256E, 256G) arranged at a respective first end of the respective one of the identified element(s) 112 (e.g., elements 410, 411, 412, 513, respectively). Each of the identified element(s) 112 further includes a respective second IDU 256B, 256D, 256F, 256H arranged at a respective second end of the respective one of the identified element(s) 112 (elements 410, 411, 412, 513, respectively). Each respective second IDU 256B, 256D, 256F, 256H is operatively connected to the telemetry link (315) to provide to the topology controller (210) a respective second identifier.

In some of these aspects, for each of the identified element(s) 112, the respective first identifier and the respective identifier are the same. This identifier is referred to herein as a "common identifier" of the respective one of the identified element(s) 112. the first IDUs 256A, 256C, 256E, 256G and the second IDUs 256B, 256D, 256F, 256H of each of the identified element(s) 112 (elements 410, 411, 412, 513, respectively) are each configured to provide the common identifier of the respective identified element 112 to the topology controller 210 via the telemetry link 315. For example, IDUs 256A, 256B can each provide one and the same common identifier corresponding to element 410. This can advantageously reduce the size of the topology information stored in equipment database 310 and the time required to determine the topology of the seismic detection line, while preserving the ability to localize faults between identified element(s) 112.

In others of these aspects, for each of the identified element(s) 112, the respective first identifier and the respective second identifier are different. For example, IDU 256A can provide a different identifier than IDU 256B. In some configurations, such as those using serial numbers or UUIDs as identifiers rather than product codes, each of the identified element(s) 112 has a unique respective first identifier and a unique respective second identifier. This can advantageously permit localizing faults both between and within identified element(s) 112.

Figure 6:
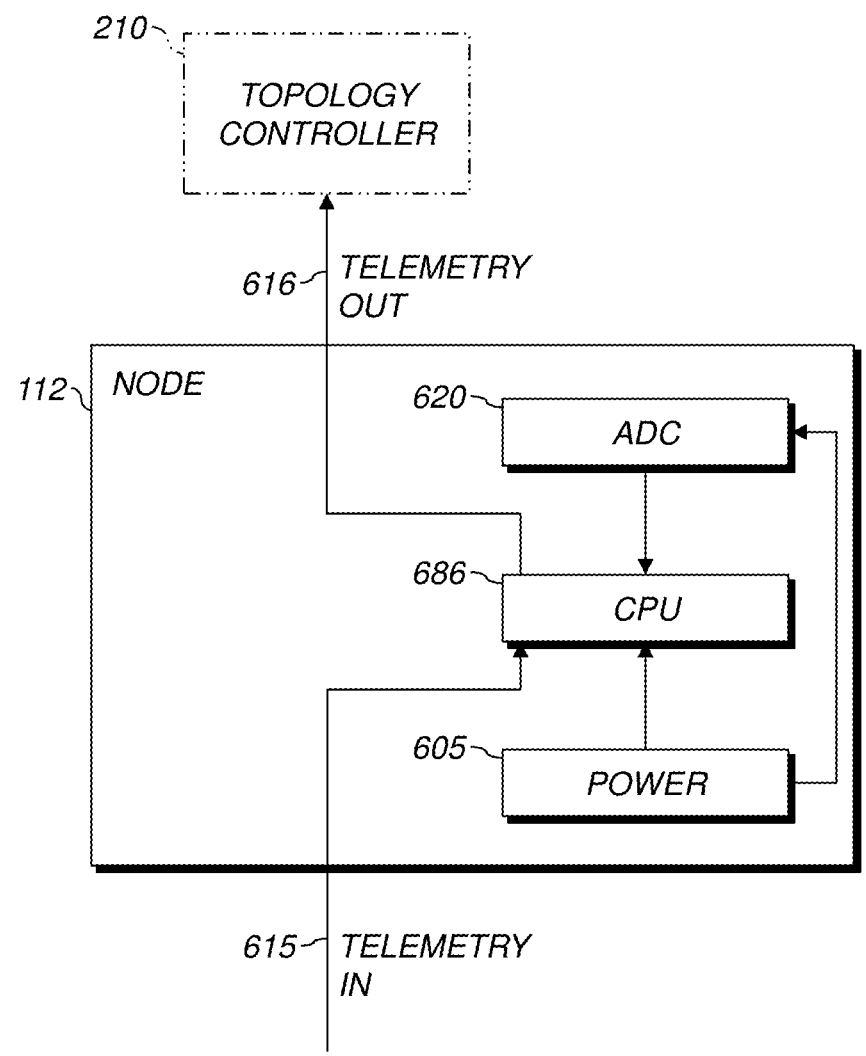
FIG. 6 is a circuit diagram of an exemplary identification unit or active element on a seismic detection line.

FIG. 6 shows an exemplary identified element 112, e.g., an IDU 256 or active element such as sensor 225 (FIG. 2B). Identified element(s) 112 can also be referred to as "nodes" and can have unique identifiers, e.g., as discussed above with reference to FIG. 3. Upstream is to the top of the figure.

Link 615 carries telemetry or identification data from downstream nodes. Link 615 can also carry other upstream-bound signals. Link 616 carries identification data from the identified element(s) 112 ("NODE") to topology controller 210 (shown in phantom). Identified element(s) 112 can include PHY, MAC, or other transceiver devices to communicate via links 615, 616.

A power link (not shown) can carry power downstream from the topology controller to the identified element(s) 112 and from the identified element(s) 112 downstream to other identified element(s), e.g., IDUs, or other devices on streamer 106. Power is supplied to electronics in identified element(s) 112 by power module 605, e.g., a regulator that provides lower voltages to operate electronics from a higher voltage power supply carried on the power link.

The illustrated identified element 112 includes a central processing unit (CPU) 686 or other processor, e.g., as discussed below with reference to FIG. 8. Processor 686 can be connected to a memory (not shown) and signal-measuring or -conditioning devices such as analog-to-digital converter (ADC) 620. ADC 620 can, e.g., provide processor 686 digital data of a hydrophone reading. Processor 686 can include or be connected to a computer-readable medium such as a tangible, non-transitory computer-readable storage medium, to hold, e.g., computer program instructions to perform methods described herein for reporting identity, or methods for processing or transmitting seismic data. For example, processor 686 can receive pings via telemetry link 315 (FIG. 3), e.g., via link 616. Processor 686 can transmit identifying information such as a MAC address or UUID via telemetry link 315 including link 616 in response to the pings.

In the exemplary sensor 225, the identified element 112 is connected to one or more peripherals (not shown), e.g., a magnetic compass or digital channel electronics unit(s). Any number of electronics units can be used in an element or section, as desired. An exemplary electronics unit can include a filter bank to filter incoming seismic data, e.g., from a MEMS accelerometer or hydrophone or another type of sensor. The filtered data can be stored in a memory or transmitted upstream by processor 686 via telemetry link 315 (FIG. 3) including link 616 to data recorder 211 (FIG. 2).

Figure 7:
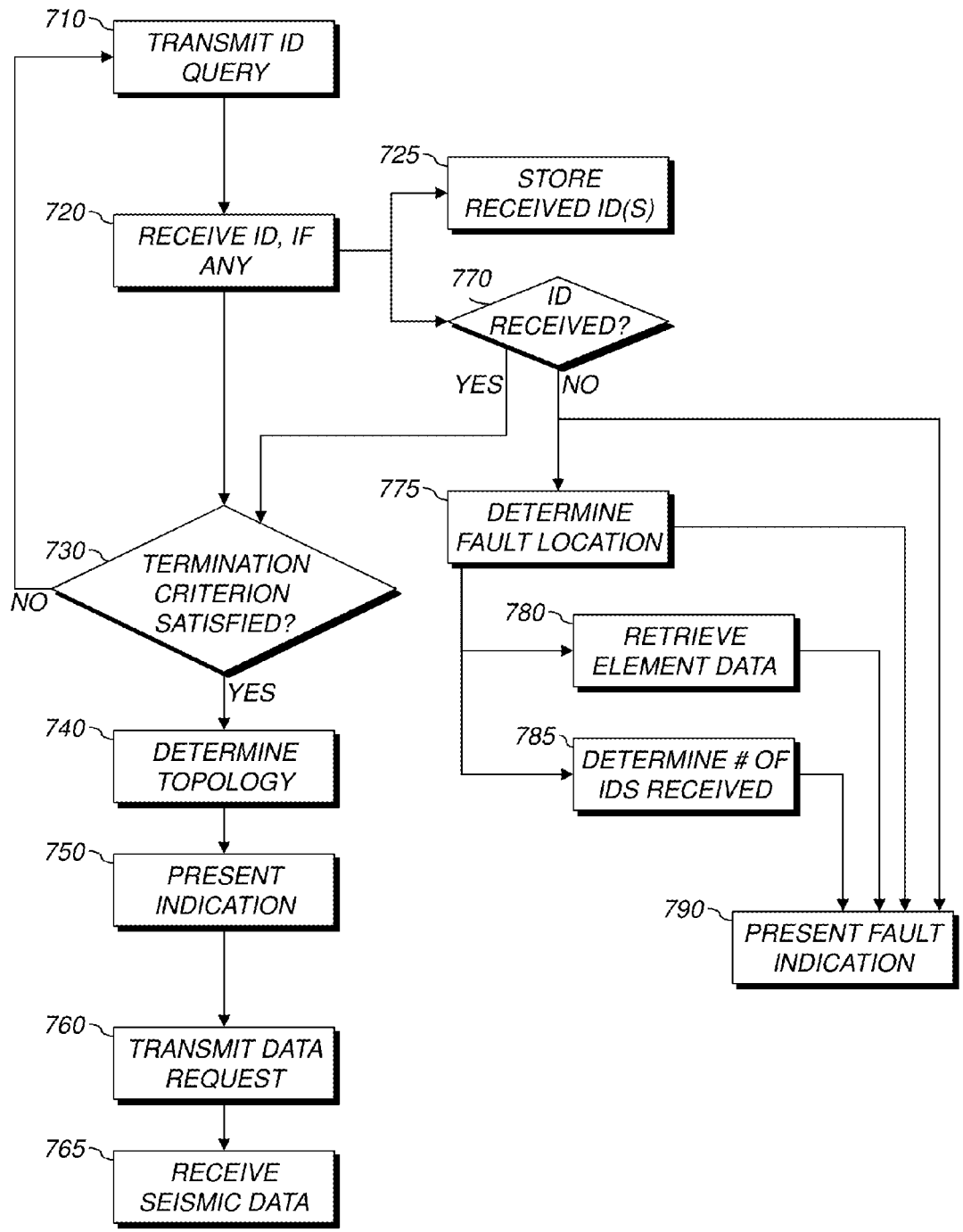
FIG. 7 is a flowchart illustrating exemplary methods for operating a seismic detection line such as the streamer shown in FIG. 2A.

FIG. 7 is a flowchart illustrating exemplary methods for operating a seismic detection line, e.g., streamer 106 shown in FIG. 1. The steps can be performed in any order except when otherwise specified, or when data from an earlier step is used in a later step. In various examples, processing begins with step 710. For clarity of explanation, reference is herein made to various components shown in FIGS. 1-6 and 8 that can carry out or participate in the steps of the exemplary method. It should be noted, however, that other components can be used; that is, exemplary method(s) shown are not limited to being carried out by the identified components. The below-described steps can be automatically performed using a processor such as processor 886 (FIG. 8, discussed below), e.g., in topology controller 210 (FIG. 2).

In step 710, a query, e.g., an identification query, is transmitted along a telemetry link 315 (FIG. 3) of the seismic detection line. The telemetry link 315 connects a plurality of identified elements of the seismic detection line in a string and each of the identified elements includes an identification unit 256 (FIG. 2) configured to transmit a respective identifier. The term "string" refers to the fact that identified elements are connected in order along telemetry link 315, and that two consecutive identified elements of the string can be adjacent on telemetry link 315 or can have any number of non-identified elements on telemetry link 315 between them.

In step 720, either the respective identifier of one of the identified element(s) is received, or a determination is made that no identifier was received. Step 720 can be followed by decision step 730. Step 720 can include step 725 or decision step 770.

In aspects using identified active elements, e.g., as noted below with reference to steps 760, 765, the detecting step can include either receiving a respective identifier of an active one of the identified elements (as opposed to or in addition to an identifier of a passive element) or determining that no identifier was received.

In step 725, the received respective identifiers are stored, e.g., in database. This can be equipment database 310 (FIG. 3) or another device or system discussed below with reference to data storage system 840 (FIG. 8). Other element data can also be stored in association with the received identifiers.

In decision step 730, it is determined whether a selected termination criterion is satisfied, e.g., whether an ID of a tail buoy 234 has been received. If so, the next step is step 740. If not, the next step is step 710. In this way, transmitting step 710 and detecting step 720 are repeated until the selected termination criterion is satisfied. In an example, the termination criterion can be the passage of a selected time after transmission of a query (step 710), during which selected time no identifier has been received. In another example, the termination criterion can be receipt of a full set of identifiers listed in the equipment database 310 (FIG. 3) as being part of the streamer 106.

In step 740, using a processor such as processor 886 (FIG. 8), an arrangement of the identified elements of the seismic detection line is automatically determined. For example, the received identifiers stored (step 725) in equipment database 310 (FIG. 3) can be arranged in order of position on the streamer In step 750, using the processor, an indication of the determined arrangement is automatically presented. For example, a visual representation such as a list or graph of the arrangement can be presented user interface system 830 (FIG. 8). In various aspects, step 750 is followed by step 760.

In step 760, a data request is transmitted along the telemetry link 315. The data request solicits seismic data from sensors 225 in active sections 224 (both FIG. 2B). Step 760 is followed by step 765.

In step 765, seismic data is received from an active element of the plurality of elements. In various aspects, the element providing the seismic data is an identified element; in other aspects, the element providing the seismic data is not an identified element.

In this way, the topology (arrangement of identified elements) of a streamer or other seismic detection line can be automatically determined, even if the streamer is either deployed or spooled on a winch. Various aspects further provide for receiving seismic data, as noted above. Various aspects provide for reporting of faults, e.g., breaks in the streamer or failures of streamer components. In these aspects, step 720 includes decision step 770.

In decision step 770, it is determined (e.g., by processor 886, FIG. 8) whether an identifier of an identified element was received in response to the query transmitted in step 710. If so, the next step is decision step 730, as discussed above. If not, the next step is step 775 or step 790. Steps 775, 780, 785, and 790 are parts of a presenting-fault-indication step according to various aspects.

In step 775, a fault location of the seismic detection line is automatically determined using the processor 886. Step 775 can be followed by step 790 and can include step 780 or step 785. The fault indication can correspond to the query (step 710) in response to which no identifier was received, i.e., to that portion of the seismic detection line which is not in communication with the topology controller 210 (FIG. 2). Also or alternatively, the fault indication can correspond to the most recent respective identifier received, i.e., to that portion of the seismic detection line which is not in communication with the topology controller 210. Since an individual element can be quite long (e.g., 50 m for an active section 224, FIG. 2), the fault location can be determined according to the needs of a particular seismic survey.

In step 780, respective element data for each of the stored identifiers are retrieved from a database. For example, the element data can include the identifiers stored in step 725. The fault location is then determined using the retrieved element data. In an example, the element data include positions on the streamer (discussed above with reference to FIG. 3) for which an identifier was received in step 720. The fault can be determined to be after the highest-numbered position on the streamer stored in the database, i.e., the highest-numbered position on the streamer for which an identifier was received.

In another example, the respective element data include respective element-length data. For example, the element-length data can indicate how many meters long each identified element is based on its respective identifier(s). The determining-fault-location step can include summing the respective element-length data for each of the stored identifiers, i.e., each of the received identifiers, and providing the sum as the determined fault location. This can provide, e.g., a physical location on a deployed streamer to which a workboat can be sent to debug the fault.

Step 785 relates to various aspects in which at least one passive element of the identified elements includes two ends having respective identifiers. An example is shown in FIG. 5B. For example, identified element 410 has IDUs 256A, 256B (all FIG. 5B) on each end. In step 785, it is automatically determined how many of two identifiers of the respective ends of the at least one passive element were received. A corresponding fault indication can then be presented (in step 790) with finer resolution than the element level.

In step 790, in various aspects, processor 886 automatically presents a fault indication. As noted above, the fault indication can correspond to the query (step 710) in response to which no identifier was received, or to the most recent respective identifier received. In an example, the presenting-fault-indication step 790 includes transmitting the fault indication via a network 850 (FIG. 8).

Step 790 can include, e.g., automatically presenting a visual indication of the determined fault location on a display screen, e.g., display 835 (FIG. 8), using processor 886. The determined fault location can be displayed as an element number, a distance in meters along the streamer, or other forms. For example, topology controller 210 can be communicatively connected to an integrated navigation system (INS) to receive coordinates and orientation of a streamer being towed. In this way, a fault location in meters along the streamer can be converted into the latitude and longitude of the fault location. This permits dispatching a workboat to that location. The fault location can also be presented as a schematic representation, e.g., a fault icon superimposed over a display similar to that of FIG. 2A.

In various aspects, presenting-fault-indication step 790 includes, using the processor, automatically presenting a visual indication of the element data stored in step 725 on a display screen such as display 835. For example, the information about the last element detected, or the first element not detected, can be presented. In an example, the information is presented as text, e.g., "no identifier was received from position 5; saw at position 4: type=in-sea module, S/N=42", where the type and S/N were retrieved from the stored element data.

In aspects using step 785 (passive elements with two identifiers, e.g., as shown in FIG. 5B), step 790 can include presenting a fault indication corresponding to a determined fault location and determined as follows: (a) if neither of the two identifiers was received, the fault indication indicates that a fault is upstream of the at least one passive element; (b) if one of the two identifiers was received, the fault indication indicates that the fault is in the at least one passive element; and (c) if both of the two identifiers were received, the fault indication indicates that a fault is downstream of the at least one passive element. Referring to FIG. 5B, in an example, element 412 is a passive identified element. If (a) neither the identifier of IDU 256E nor the identifier of IDU 256F is received, the fault indication can indicate that the fault is upstream of element 412, e.g., in element 410 or 411. If (b) the identifier of IDU 256E is received but the identifier of IDU 256F is not received, the fault indication can indicate that the fault is located in element 412. If (c) the identifiers of both IDUs 256E, 256F are received, the fault indication can indicate that the fault is downstream of element 412.

Figure 8:
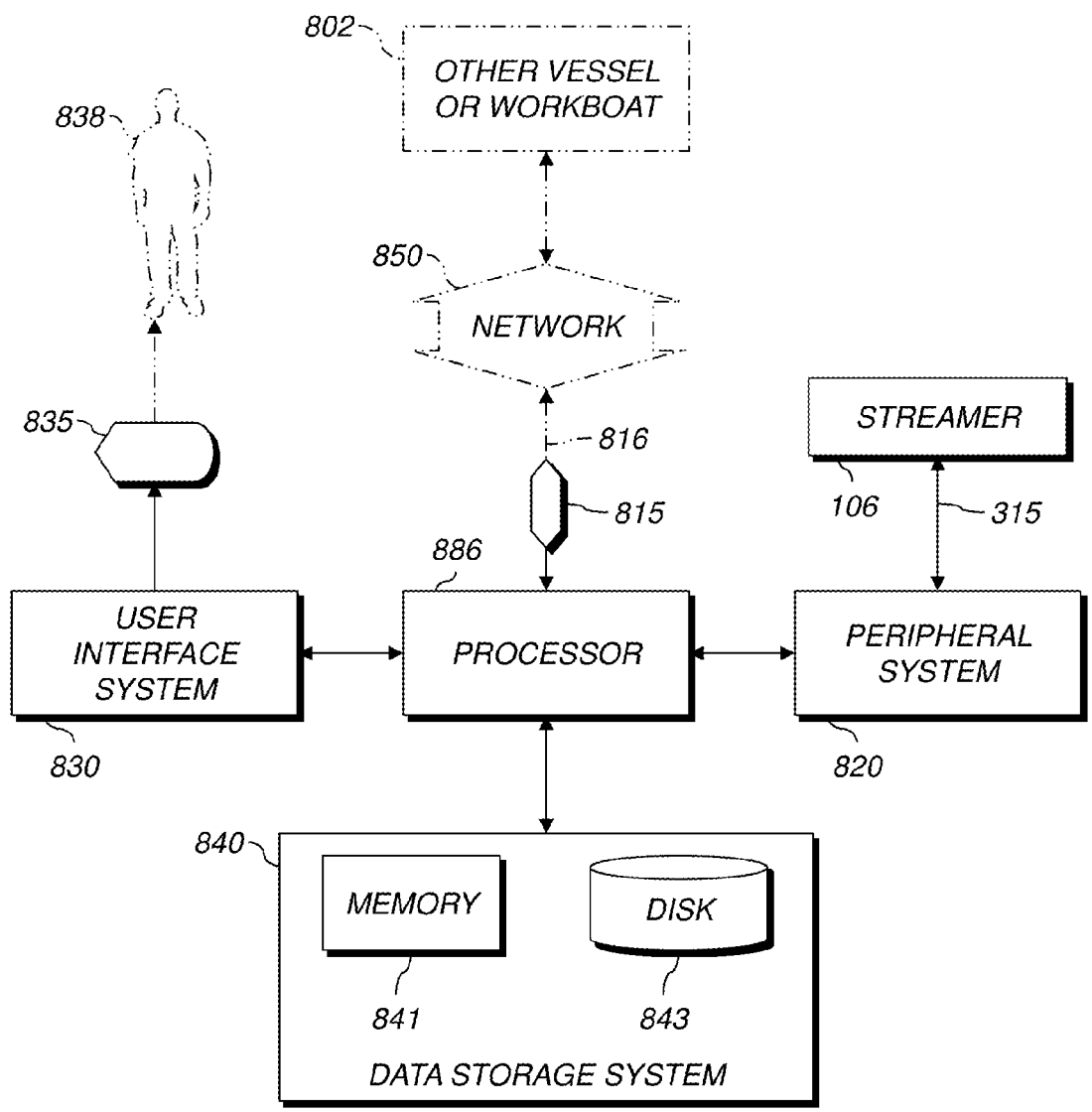
FIG. 8 is a high-level diagram showing the components of a control mechanism or other data-processing system and related components.

FIG. 8 is a high-level diagram showing the components of a data-processing system including a processor 886 connected to a peripheral system 820, a user interface system 830, and a data storage system 840. Processor 886 can be communicatively connected to a network 850 (shown in phantom). Devices 130 (FIG. 1), 210, 211, 256, 220, 224, 230, 234 (FIG. 2A), 225 (FIG. 2B), 310, 312, 320, 321, 322, 356, 357, 358, 359 (FIG. 3), 102, 411, 225A, 225B, 225C, 225D (FIG. 4), or 256A, 256B, 256C, 256D, 256E, 256F, 256G, or 256H (FIG. 5B) can each include one or more of systems 886, 820, 830, 840, and can each connect to one or more network(s) 850. Processor 886 can include one or more microprocessors, microcontrollers, field-programmable gate arrays, application-specific integrated circuits, programmable logic devices (PLDs), or digital signal processors. In an aspect, systems 886, 820, 830, 840 are embodied in a computer located on vessel 102 or a workboat, and processor 886 is connected to a similar data processing system on another vessel 102 or workboat (referenced collectively by reference number 802) via network 850 or another communications link.

In an example, data storage system 840 includes memory 841, e.g., a random-access memory (RAM), and disk 843, e.g., a tangible computer-readable storage device such as a hard drive, floppy disk, Compact Disc, DVD, read-only memory (ROM), or erasable programmable read-only memory (EPROM, EEPROM, or Flash). Computer program instructions are read into memory 841 from disk 843. Processor 886 then executes one or more sequences of the computer program instructions loaded into memory 841, as a result performing process steps described herein. In this way, processor 886 carries out a computer implemented process. For example, steps of methods described herein or blocks of the flowchart illustrations (e.g., FIG. 7) or block diagrams herein can be implemented by computer program instructions. Memory 841 can also store data, e.g., data of locations of streamer components or other data described above with reference to equipment database 310 (FIG. 3).

The peripheral system 820 can include one or more devices configured to communicate data between the processor 886 and other systems. For example, the peripheral system 820 can receive data from receivers 140 (FIG. 1) or can receive identification data from IDUs 256 or other components shown in FIGS. 2A-2B. The processor 886, upon receipt of data from the peripheral system 820, can store such data in the data storage system 840. For example, topology controller 210 (FIG. 2A) can include processor 886 and peripheral system 820 connected to telemetry link 315 of streamer 106, as shown. Data recorder 211 (FIG. 2A) can also include a respective processor 886 and a respective peripheral system 820 connected to telemetry link 315.

The user interface system 830 can include a mouse, a keyboard, a display 835, a touchscreen, or other devices for conveying data between the processor 886 and a user 838 (shown in phantom). In various embodiments, the processor 886 is further configured to present a visual representation of components of streamer 106 and their topology (e.g., relative locations) to user 838 via display 835, e.g., a CRT, LCD, or OLED display.

In various embodiments, processor 886 is connected to network 850 via communication interface 815 (both shown in phantom). For example, communication interface 815 can include a radio communicating via a wireless link. Communication interface 815 sends and receives electrical, electromagnetic or optical signals that carry digital or analog data streams representing various types of information to and from network 850. Processor 886 can send messages and receive data or program code through network 850 and communication interface 815.

Various embodiments herein include computer program products having computer program instructions stored on a tangible, non-transitory computer-readable medium, e.g., disk 843. Such a medium can be manufactured as is conventional for such articles, e.g., by pressing a CD-ROM or writing a disk image to a hard drive. When the stored instructions are executed by processor 886, those instructions cause processor 886 to carry out functions, acts, or operational steps of various embodiments here, e.g., as discussed above with reference to FIGS. 2A and 7.

According to the foregoing, various aspects provide identification of elements of a streamer, whether those elements are active or passive. A technical effect of various aspects is to transmit signals to IDUs 256 on a streamer 106 (both FIG. 2A) and receive identification information. A further technical effect is to present on an electronic display a visual representation of the topology of streamer 106, e.g., the order and type of elements on streamer 106.

Various aspects advantageously determine and track topology so that survey personnel are relieved of the need to write down what is physically on his seismic line and keep track of it when the line is being deployed or recovered. This reduces the probability of erroneous results, downtime, or other negative consequences that may result from human error. Various aspects advantageously permit the survey operator to reliably determine at any time what is physically connected to the seismic line.

Various aspects advantageously permit viewing topology regardless of the physical disposition of the streamer or other seismic line. Even when the seismic line is stored on a winch or dumped on the floor, a user can connect the topology controller 210 (FIG. 2A) or other topology-determining subsystem to the seismic line and directly view the topology. This permits confirming that desired equipment is present on the streamer, reducing the need to perform manual handling operations to determine streamer contents. A reduction in manual handling of the streamer can also improve worker safety.

In various aspects, a topology-determining subsystem communicates with an equipment database to improve equipment logistics onboard a seismic vessel. For example, analyzing topology data over time can permit more accurately predicting when repairs will be required or preventative maintenance should be performed.

As noted above, in prior schemes, when several passive sections are serially connected and a telemetry failure occurs, it can be difficult to localize the fault except disconnecting and testing sections one by one. Various aspects advantageously facilitate troubleshooting. When using IDUs, if a telemetry failure occurs, and the section requiring maintenance can be readily identified as, e.g., the section containing or immediately following the most upstream IDU to respond.

Various aspects advantageously include the topology-determining subsystem interfaced with a navigation or topographic system in order to give the inline offset for each element. This was discussed above with reference to FIGS. 4 and 7.

It should be understood that this description is not intended to limit the invention. On the contrary, the exemplary embodiments are intended to cover alternatives, modifications and equivalents, which are included in the spirit and scope of the invention. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter may include other examples that occur to those skilled in the art. Such other examples are intended to be within the scope of the claims.

What is claimed is:

1. A seismic detection line, comprising:
   one or more identified element(s) arranged in a string along the seismic detection line; and
   a telemetry link connecting the identified element(s) along the string and configured to convey (1) seismic data from at least one of the identified element(s) to a data recorder and (2) identification data to a topology controller,
   wherein each of the identified element(s) includes a respective first identification unit operatively connected to the telemetry link to provide a respective first identifier to the topology controller, and
   wherein the at least one of the identified element(s) includes an active seismic element housing one or more receivers that generate the seismic data based on detected seismic waves.

2. The seismic detection line of claim 1, wherein at least one of the identified element(s) belongs at least to the group of an active section configured to provide seismic data, a bird, a recovery device, a ranging section, and a mammal detection section.

3. The seismic detection line of claim 1, wherein at least one of the identified element(s) belongs at least to the group of a deck cable, a slip ring, a lead-in, a head stretch section, a tail end stretch section, a passive section, a tail end stretch section, a tail swivel, a tail buoy jumper, and a tail buoy.

4. The seismic detection line of claim 1, wherein the one or more identified element(s) includes all the active seismic elements and all the passive elements on the seismic detection line.

5. The seismic detection line of claim 1, further including at least one non-identified active seismic element arranged along the string and operatively connected to provide seismic data to the data recorder.

6. The seismic detection line of claim 1, wherein the one or more identified element(s) include at least one active seismic element configured to provide seismic data to the data recorder.

7. The seismic detection line of claim 1, wherein the telemetry link is configured to convey the seismic data and the identification data using a common link.

8. The seismic detection line of claim 1, wherein each of the respective first identification units is arranged at a respective first end of the respective one of the identified element(s), and each of the identified element(s) further includes a respective second identification unit arranged at a respective second end of the respective one of the identified element(s), each respective second identification unit operatively connected to the telemetry link to provide to the topology controller a respective second identifier.

9. The seismic detection line of claim 8, wherein the first and second identification units of each of the identified element(s) are further configured to provide a common identifier to the topology controller via the telemetry link.

10. The seismic detection line of claim 8, wherein, for each of the identified element(s), the respective first identifier and the respective second identifier are different.

11. The seismic detection line of claim 10, wherein each of the identified element(s) has a unique respective first identifier and a unique respective second identifier.

12. The seismic detection line of claim 1, wherein the seismic detection line is a streamer and at least one of the identified element(s) is configured to be mounted to a winch.

13. The seismic detection line of claim 1, wherein the seismic detection line includes a land cable.

14. The seismic detection line of claim 1, wherein the one or more identified element(s) include one or more bird(s) attached to the seismic detection line and configured to assist in positioning the seismic detection line.

15. The seismic detection line of claim 1, wherein the seismic detection line is configured to be deployed on a bed of a body of water.

16. A seismic detection system, comprising:
a seismic detection line including:
one or more identified element(s) arranged in a string along the seismic detection line, and
a telemetry link connecting the identified element(s) along the string and configured to convey (1) seismic data from at least one of the identified element(s) to a data recorder and (2) identification data to a topology controller,
wherein each of the identified element(s) includes a respective first identification unit operatively connected to the telemetry link to provide a respective first identifier to the topology controller; and
a processor operatively coupled to the telemetry link and configured to successively query the identified elements for their respective identifiers, determine an arrangement of the seismic detection line using the received identifiers, and present an indication of the determined arrangement.

17. The system according to claim 16, wherein the processor is further configured to present a fault indication corresponding to an element from which no respective identifier is received.

18. The system according to claim 16, wherein the one or more identified element(s) includes at least one active seismic element configured to transmit seismic data via the telemetry link and the processor is configured to record the seismic data from the active seismic element via the telemetry link.

19. A method of operating a seismic detection line, the method comprising:
transmitting a query along a telemetry link of the seismic detection line, wherein the telemetry link connects a plurality of identified elements of the seismic detection line in a string and each of the identified elements includes an identification unit configured to transmit a respective identifier;
detecting whether the respective identifier of one of the element(s) was received or not;
repeating the transmitting and detecting steps until a selected termination criterion is satisfied;
using a processor to automatically determine an arrangement of the identified elements of the seismic detection line; and
using the processor to automatically present an indication of the determined arrangement.

20. The method according to claim 19, further including:
if no identifier was received, using the processor, automatically presenting a fault indication corresponding to the query in response to which no identifier was received, or to the most recent respective identifier received.

* * * * *